United States Patent
Kitlinski et al.

(10) Patent No.: US 7,215,205 B2
(45) Date of Patent: May 8, 2007

(54) POWER AMPLIFIER ARRANGEMENT AND METHOD FOR PROCESSING A RADIOFREQUENCY SIGNAL

(75) Inventors: Krzysztof Kitlinski, München (DE); Alfons Schmid, München (DE); Boris Kapfelsperger, Igling (DE); Günter Donig, Poing (DE)

(73) Assignee: Infineon Technologies AG, Munich (DE)

( * ) Notice: Subject to any disclaimer, the term of this patent is extended or adjusted under 35 U.S.C. 154(b) by 123 days.

(21) Appl. No.: 11/168,960

(22) Filed: Jun. 28, 2005

(65) Prior Publication Data

US 2006/0022756 A1    Feb. 2, 2006

(30) Foreign Application Priority Data

Jun. 30, 2004  (DE) ................. 10 2004 031 687

(51) Int. Cl.
*H03F 3/14* (2006.01)
(52) U.S. Cl. ................. 330/307; 330/302; 330/126
(58) Field of Classification Search ............. 330/307, 330/302, 295, 126
See application file for complete search history.

(56) References Cited

U.S. PATENT DOCUMENTS

| | | | |
|---|---|---|---|
| 6,177,841 B1 * | 1/2001 | Ohta et al. | 330/302 |
| 6,298,244 B1 * | 10/2001 | Boesch et al. | 455/553.1 |
| 6,496,708 B1 * | 12/2002 | Chan et al. | 455/553.1 |
| 6,674,337 B2 * | 1/2004 | Hashemi et al. | 333/32 |
| 6,980,057 B2 * | 12/2005 | Morimoto et al. | 330/286 |
| 7,119,623 B2 * | 10/2006 | Blednov et al. | 330/302 |

OTHER PUBLICATIONS

*RF Power Amplifiers for Wireless Communications*, "4.3 Shorting the Harmonics", Steve C. Cripps, Artech House, Inc., 1999, 8 pgs.

* cited by examiner

*Primary Examiner*—Patricia Nguyen
(74) *Attorney, Agent, or Firm*—Eschweiler & Associates, LLC

(57) ABSTRACT

A power amplifier arrangement comprises a power amplifier in a semiconductor body. At least one first input terminal on the surface of the semiconductor body is provided for feeding in a signal to be amplified. A first output tap of the arrangement is designed for outputting a signal with a first center frequency; a second and a third output tap are designed for outputting a second signal with a second center frequency. A line wire is respectively connected to the second and third output taps on the surface of the semiconductor body. According to the invention, a charge store is provided, which is coupled to the third output tap and is designed for forming a series resonant circuit with the line wire connected to the third output tap.

19 Claims, 2 Drawing Sheets

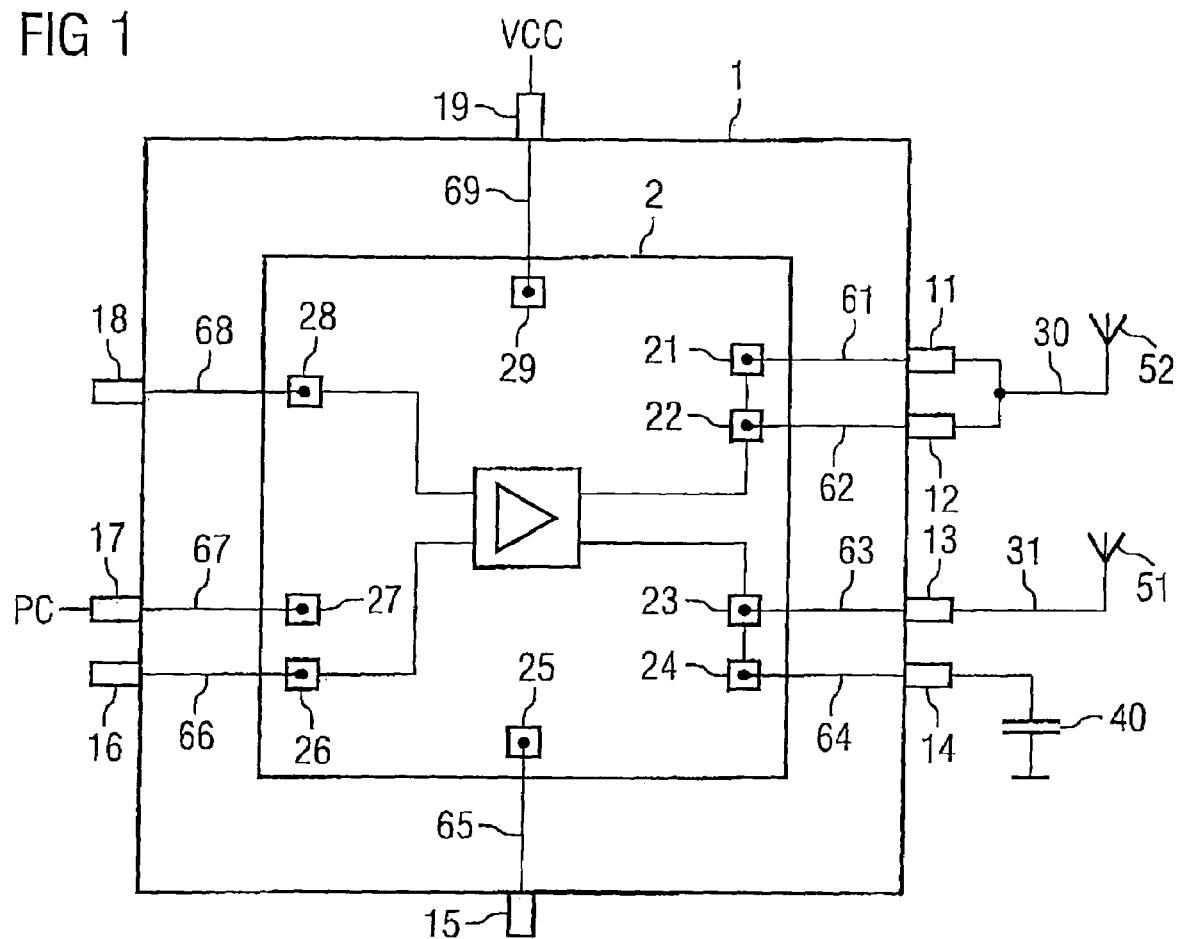
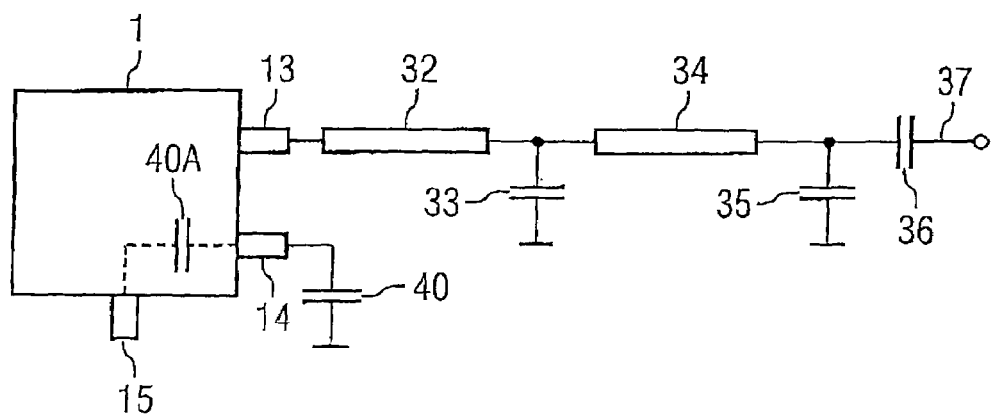

POWER AMPLIFIER ARRANGEMENT AND METHOD FOR PROCESSING A RADIOFREQUENCY SIGNAL

REFERENCE TO RELATED APPLICATIONS

This application claims the benefit of the priority date of German application DE 10 2004 031 687.2, filed on Jun. 30, 2004, the contents of which are herein incorporated by reference in their entirety.

FIELD OF THE INVENTION

The invention relates to a power amplifier arrangement and to a method for processing a radiofrequency signal.

BACKGROUND OF THE INVENTION

The increasing miniaturization and the required flexibility of mobile radio systems make it necessary to design power amplifiers for the transmission path of a mobile radio device as integrated circuits in a semiconductor body with increasingly smaller dimensions. Moreover, modern mobile radio devices are embodied such that they operate with a plurality of different mobile radio standards which transmit their signals at different frequencies. One example thereof is devices for the WLAN standards 802.11a,b and 802.11g, the frequency bands of which lie in the region of 2.4 GHz and 5.1 GHz. At different frequencies, it may become necessary to provide a plurality of different power amplifiers for the individual frequency bands. However, such a solution is not expedient for cost and space reasons.

One alternative to this is an integrated power amplifier having a plurality of amplifier sections arranged in parallel, each individual amplifier section being optimized for a specific frequency band. In this case, the signal to be amplified is applied to different inputs that are assigned to the amplifier sections. The outputs of the amplifier are connected to a common or to different antennas by suitable means. One example of a power amplifier is the PMB 8825 amplifier from Infineon Technologies AG. This amplifier is designed principally for amplifying signals according to the Wireless LAN mobile radio standard. The standard uses the freely available frequency bands (ISM bands) in the range of 2.4 GHz to 2.5 GHz and also 5.15 GHz to 5.825 GHz. The PMB 8825 power amplifier is based on Si—Ge technology and has in each case dedicated input terminals and output taps for the individual frequency bands.

Particularly in the region of the two frequency bands for the Wireless LAN standards IEEE 802.11a, 11b and 11g it is necessary to ensure sufficient adjacent channel rejection. What is problematic in the case of power amplifiers having a plurality of parallel amplifier types for individual frequency bands is crosstalk of harmonic frequency components of a signal into another amplifier section. By way of example, crosstalk is readily possible precisely in the case of amplifiers for the frequency bands 2.4 GHz to 2.5 GHz and 5.15 GHz to 5.825 GHz. Crosstalk is effected inter alia when, in the case of an output signal of 2.4 GHz, the signal component of the second harmonic of the output signal at 2.4 GHz couples over to the 5 GHz output of the power amplifier. Harmonic components or harmonics for short represent signals whose frequency corresponds to integral multiples of the frequency of the actual useful signal.

Important harmonic components are the second harmonic at double the useful signal frequency, and the third harmonic at triple the frequency. Harmonic components are generated by nonlinear behavior in active components of the amplifier, for example in the power transistors. Crosstalk of the harmonics into the parallel-arranged amplifier sections of other frequency ranges necessitates complicated shielding measures within and outside the chip.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides a power amplifier in which crosstalk is reduced using simple mechanisms. Furthermore, the invention also provides a method for amplifying a radiofrequency signal in which undesired signal components are reduced.

According to an aspect of the present invention, a power amplifier arrangement having a semiconductor body is formed and comprises a power amplifier formed within the semiconductor body. The arrangement has at least one first input terminal on a surface of the semiconductor body for feeding in a signal to be amplified. Furthermore, the power amplifier arrangement comprises at least one first output terminal on the surface of the semiconductor body for outputting a first signal. The first signal has a first center frequency. Moreover, a second output tap and also a third output tap are provided on the surface of the semiconductor body at a distance from the first output tap. The second and third output taps are designed for outputting a second signal. The second signal has a second center frequency. Furthermore, a line wire characterized by an inductance is connected to the second output tap and also to the third output tap. Finally, a charge store is provided, which is coupled to the third output tap and is designed for forming a resonant circuit together with the line wire connected to the third output tap. The center frequency is that frequency at which the useful signal is output.

The charge store forms a resonant circuit with a transfer characteristic which, in the output signal at the second and at the third output tap, leads to a suppression of undesired components and in particular harmonic components of the output signal. To put it another way, the means produces a series resonant circuit for undesirable harmonic components in the second output signal, thereby reducing crosstalk of harmonic components to the first output tap.

In accordance with another aspect of the present invention, the charge store comprises a capacitor, the first terminal of which is connected to the third output tap and the second terminal of which is connected to a reference potential. The charge store is thus connected to the line wire characterized by the inductance. A simple resonant circuit or a high-pass filter with a specific characteristic is thus formed.

In accordance with another aspect of the present invention, the charge store is arranged outside the semiconductor body and may also be arranged outside the housing. In this aspect, the line wires form a connection between output taps or terminal pads on the surface of the semiconductor body and pins arranged on the housing. In another development of the invention, the distance between the third output tap and the first output tap on the surface of the semiconductor body is greater than the distance between the second output tap and the first output tap.

In another refinement, the charge store is connected to a second output tap of the housing within the housing. It is thus arranged within the housing and, if appropriate, completely enclosed by the latter. The two taps can then form a tap for the output signal at the second center frequency and the tap for feeding in a reference potential.

The invention thus provides a power amplifier having a first and at least one second power amplifier section arranged in parallel, which is formed in each case with a first output tap for outputting a first signal with a first center frequency and two further output taps for outputting a signal with a second center frequency. One of the two output taps for outputting a signal with the second center frequency is coupled to a charge store in order to form a resonant circuit. A signal present on the input side is then amplified by the power amplifier and output at the two output taps. Components comprising harmonic signal components of the signal output are suppressed by the resonant circuit and crosstalk of these components to the first output tap is reduced.

Since crosstalk is effected by a coupling of the taps, one refinement of the method according to the invention provides for said taps to be spaced apart spatially to the greatest possible extent. In particular in one development, the charge store is coupled to the output tap which is spaced apart spatially the furthest from the at least one first output tap.

In a further refinement, the charge store, after the production of the amplifier, is connected by its terminals to the taps on the housing.

According to the invention, an amplified overall signal, having not only the useful signal but also interfering signal components, is fed to a resonant circuit whose resonant frequency corresponds to the frequency of an interfering signal component. As a result, the useful signal is attenuated within the resonant circuit, while the inherently interfering component experiences a resonance. If the resonator is connected to one of two output taps, then the undesired signal component is extracted away from the second output tap, so that the pure useful signal can be tapped off at the second output tap.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

The invention is explained in detail below on the basis of exemplary embodiments with reference to the drawings in which:

FIG. 1 Shows a first exemplary embodiment of the invention.

FIG. 2 Shows an exemplary embodiment with a matching network connected thereto.

DETAILED DESCRIPTION OF THE INVENTION

Figure 3A:
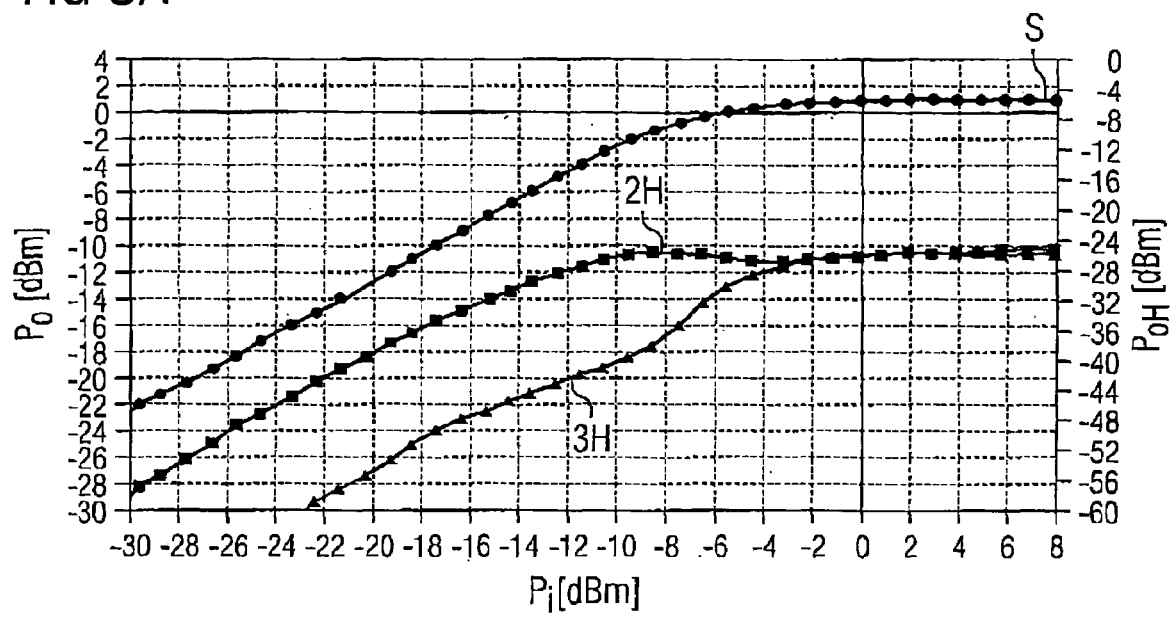
FIG. 3A Shows a comparison of measurement results of the prior art with the exemplary embodiment in accordance with FIG. 1.

One or more implementations of the present invention will now be described with reference to the attached drawings, wherein like reference numerals are used to refer to like elements throughout, and wherein the illustrated structures are not necessarily drawn to scale.

FIG. 1 shows a configuration of a power amplifier according to the invention. The power amplifier is formed with two separate power amplifier sections, not illustrated here for reasons of clarity, as an integrated circuit in a semiconductor body 2. A silicon-germanium technology is used for the realization of the individual amplifier sections, this technology being distinguished principally by a particularly low-noise behavior and a high current-carrying capacity. The power amplifier is formed with two individual amplifier sections operating at different frequency bands. A plurality of terminal contacts are applied as contact pads on the surface of the semiconductor body. Some of the contact pads serve for feeding in a supply current or control signals. Other contacts on the surface are fed the signals to be amplified or the amplified signals are tapped off from them.

The power amplifier in the semiconductor body 2 is embedded in a housing having a plurality of terminal pins. The housing comprises a plastic that completely encloses the semiconductor body. It is applied for example in liquid or semisolid form and then cures. This ensures a best possible protection of the circuits situated therein. However, various production procedures exist for this purpose which surround the semiconductor body 2 with a housing and protect it from damage.

The terminal pins 11 to 19 are made of a conductive material and fixedly incorporated into the housing. In the interior of the housing, they are connected to bonding wires 61 to 69 leading to the corresponding contact pads 21 to 29 on the surface of the semiconductor body 2. As a result, all contact pads on the surface of the semiconductor body 2 are connected to correspondingly assigned terminal pins of the housing.

Specifically, via the terminal pins 15 and 19 of the housing 1, a supply voltage VCC is fed via the lines 65 to 69—formed as bonding wires—to the terminal pads 25 and 29 and thus to the power amplifier. The supply voltage VCC serves for current and voltage supply during operation of the power amplifier. Via the terminal pins 18 and 16 of the housing 1, signals are passed via the bonding wires 68 and 66 to the terminal contact pads 28 and 26 connected thereto. In this case, the terminal pad 26 represents the signal input for the power amplifier section which amplifies signals in the range of 2.4 GHz to 2.5 GHz. The signal present at the terminal pin 16 has a center frequency of between 2.4 GHz and 2.5 GHz.

The contact pad 28 leads to the second power amplifier section for amplifying a signal with the center frequency 5.15 GHz to 5.825 GHz. In order to prevent crosstalk of the signals present on the input side, the two terminal contact pads 28 and 26 are spatially separated from one another to the greatest possible extent.

The terminal pad 17, which is connected to the contact pad 27 via the bonding wire 67, carries a signal PC for setting the output power of the power amplifier according to the invention. The contact pad 27 is internally connected to a logic circuit (not illustrated for reasons of clarity). The latter evaluates a control signal PC, which determines the power gain for the two amplifier sections. The logic circuit controls a gain in the two individual amplifier types according to the evaluation.

On the output side the two amplifier sections in each case contain two contact pads which are connected to two output pins of the housing 1 via two bonding wires arranged parallel to one another. For the power amplifier section for amplifying a signal in the 5 GHz ISM frequency band, the two contact pads 21 and 22 are provided, which are connected to the terminal pins 11 and 12, respectively, via the bonding wires 61 and 62. The two terminal pins 13 and 14 of the housing 1 are connected via the bonding wires 63 and 64 to the contact pads 23 and 24 on the surface of the semiconductor body 2. The two contact pads 23 and 24 form the output taps for the amplifier section in the 2.4 GHz frequency band.

The contact pads 21, 22 and 23, 24 for the two parallel amplifier sections are also arranged such that they are greatly spaced apart spatially. This reduces a magnetic coupling of the bonding wires of the two power amplifier sections which lead to the terminal pins 11, 12 and 13, 14. In an expedient manner, the magnetic coupling of the bonding wires of each individual amplifier section may also be used for matching the output of the power amplifier and elements connected downstream.

While operation is in progress, usually one of the two amplifier sections is active and amplifies a signal present on the input side at the terminal pins 16 and 18. On account of the parallel arrangement of the output bonding wires 61, 62 and 63, 64, however, crosstalk of signals output on the output side into the respective other signal path may occur despite the spatial distance. Thus, it is possible, for example, for that component of the second harmonic component of a signal at 2.4 GHz which is output at the contact pads 23 and 24 to be coupled into the bonding wires 61 and 62 by means of a magnetic coupling. This leads to the outputting of a signal in the region of 5 GHz at said output even if the first power amplifier section is switched off.

Given a corresponding gain in the second power amplifier section, the amplitude of the first harmonic, which is referred to as second harmonic, in the region of 5 GHz, may exceed a permissible limit value prescribed by the mobile radio standard used. FIG. 3A shows the signal profile of a signal coupled into the bonding wires 61 and 62 during an amplification in the second amplifier path.

In this case, the input power in dBm is plotted on the abscissa. The left-hand scale division shows the output power in dBm-, and the right-hand division of the abscissa of FIG. 3A shows the output power of the harmonic components in dBm. A signal present on the input side with an input power Pi is amplified in the second amplifier section and output to the terminal pins 13 and 14 via the bonding wires 63 and 64. On account of the magnetic coupling, a part of the amplified signal is coupled into the bonding wires 61, 62 and thus output at the terminal pins 11 and 12 of the 5 GHz path. The signal S coupled in given a power of 0 dBm present on the input side amounts to approximately 1 dBm at the pins 11 and 12, and that of the third harmonic 3H approximately −26 dBm. However, the signal S coupled in has a center frequency of approximately 2.4 gigahertz, while the frequency of the third harmonic is approximately 7.5 gigahertz. These frequency ranges can be suppressed to a correspondingly great extent by means of suitable simple measures, for example by means of a simple matching filter connected to the terminal pins 11 and 12.

The situation is different, however, in the case of the component of the second harmonic 2H, which is likewise output at approximately −25 dBm at the terminal pins 11 and 12 given a power of the input signal of 0 dBm. This signal lies in the frequency range of the first amplifier section thus at approximately 5 GHz.

According to the invention, the terminal pin 14 is connected to a capacitor 40 for the purpose of suppression. Said capacitor 40, together with the bonding wire 64 having an inductance, forms a series resonant circuit with a corresponding transfer characteristic. Given a suitable choice of the capacitor 40, a resonance in a frequency range is thus achieved which corresponds to the second harmonic of the signal output on the output side. The magnetic coupling between the bonding wires of the first and second amplifier sections is significantly reduced by this arrangement, thereby also reducing the parasitic signal at the 5 GHz output 11 and 12. One reason for this resides in the current component of the bonding wire 63, which carries the component of the second harmonic 2H and which is adjacent to the terminal contacts 21 and 22 and the pins 11 and 12. This current component is reduced by the resonant circuit, thus resulting in a sufficient suppression of the second harmonic 2H at the outputs 11 and 12. Furthermore, the contact pad 24 of the second power amplifier section that is remote and thus spaced apart the furthest from the contact pads 21 and 22 on the surface of the semiconductor body 2 can be employed. As a result, the current path of the resonant circuit comprising the bonding wire 64 and the capacitor 40, which generates the principal amplitude at the second harmonic, is spatially spaced apart as far as possible from the 5 GHz path and the magnetic coupling between this path and the bonding wire 64 is correspondingly reduced.

Figure 3B:
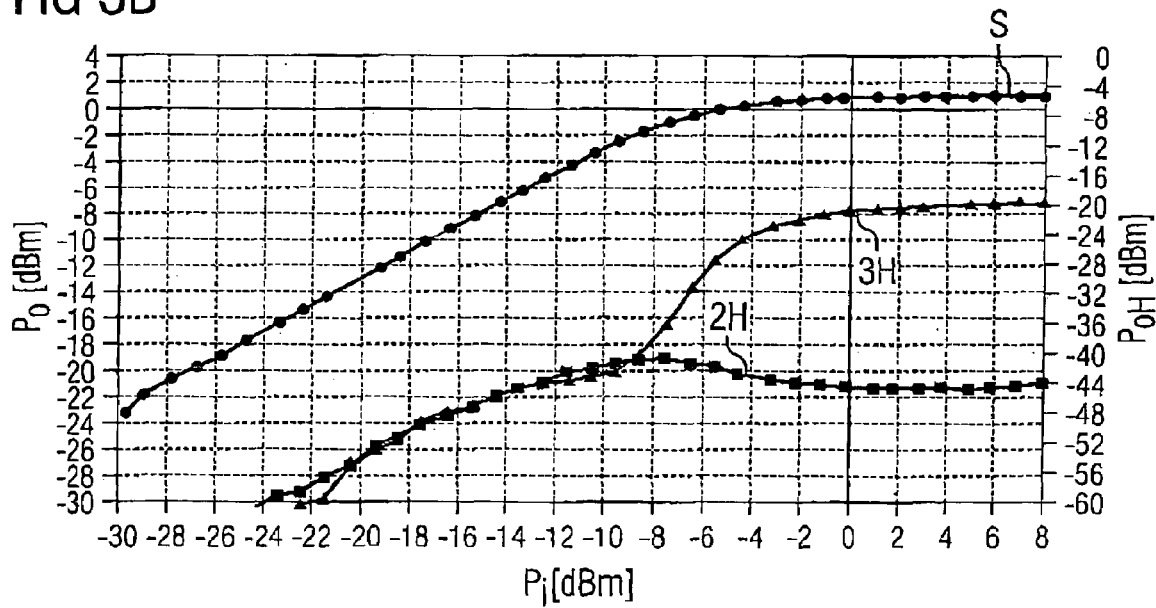
FIG. 3B Shows a comparison of measurement results of the prior art as a function of power present with the exemplary embodiment in accordance with FIG. 1.

FIG. 3B shows the crosstalk-effecting signal components of the second and third harmonics 2H, 3H and of the principal signal at the 5 GHz output at the terminal pins 11 and 12 as a function of a power present on the input side in the second power amplifier section given the presence of a series resonance comprising the inductance of the bonding wire 64 and the capacitance of the charge store 40.

While the crosstalk-effecting component S at 2.4 gigahertz and the associated third harmonic 3H at 7.5 gigahertz hardly change in comparison with FIG. 3A, a significant reduction of the second harmonic 2H can be seen. Given a power of 0 dBm present on the input side, the signal amplitude of the second harmonic is reduced by approximately 20 dB at the terminal pads 11 and 12.

FIG. 2 shows a development of the power amplifier according to the invention. Components that are identical in terms of their function bear identical reference symbols in this case. In this case, the two terminal pins 13 and 14 of the housing 1 are embodied separately and are not connected to one another outside the housing. However, a connection is present within the housing and in particular within the semiconductor body 2, which connection leads to a common output amplifier stage. The terminal pin 14 is connected to a tunable capacitor. As a result, the resonant frequency of the series resonant circuit formed from the line (not illustrated) within the housing 1 and the capacitor is tunable. Consequently, an optimum setting for the suppression can be implemented depending on the center frequency of the signal to be output.

Furthermore, for the purpose of matching to an external antenna 37, the output pin 13 is connected to a matching network. The matching network has two series-connected striplines having a different length 32 and 34 for matching to a 50 ohm characteristic impedance. A capacitance 33 is connected between the two striplines 32 and 34. The stripline 32 is connected to the output pin 13 by one terminal.

Furthermore, an isolating capacitor 36 is provided between the output 37 and the second stripline 34. Connected between the capacitor 36 and the stripline 34 is a further capacitor 35, the second terminal of which is connected to ground. This matching network is optimized to the antenna 51 connected to the terminal 37 in the desired frequency range of 2.4 GHz to 2.5 GHz. The capacitor 40 is again chosen such that it forms a series resonance together with the bonding wire (not illustrated here) leading from the terminal pin 14 to the semiconductor contact pad.

The example presented here with the capacitor 40 arranged externally can equally also be realized with a capacitor arranged within the housing 1. This capacitor is then connected, within the housing 1, to the terminal pin 14 and also a terminal pin carrying ground potential. This embodiment is illustrated in the form of a capacitor 40 A depicted in dashed fashion. It has the advantage that the capacitor is protected by the housing. The embodiment described here can also be applied to amplifiers having more than two amplifier sections. In this case, in order to reduce a magnetic coupling-in, the resonant circuit respectively realized should be spaced apart as far as possible from the bonding wires that connect the amplifier section of the corresponding frequency of the second harmonic to the terminal pins.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

LIST OF REFERENCE SYMBOLS

1: Housing
2: Semiconductor body
11, 12: Output pins of the first amplifier section
13, 14: Output pins of the second amplifier section
15, 19: Supply service
16, 18: Terminal pins for input signals
17: Terminal pin for control signal
21 to 29: Contact pads
61 to 69: Bonding wires
32, 34: Stripline
33, 34, 36: Capacitors
51, 52: Antenna
30, 31: Feed line
40: Resonant circuit capacitor
S: Useful signal
2H: Second harmonic
3H: Third harmonic

What is claimed is:

1. A power amplifier arrangement, comprising:
   a semiconductor body having a surface and a plurality of taps arranged on the surface of the semiconductor body;
   a power amplifier having at least one input for feeding in a signal to be amplified and having a first output designed for outputting a first signal with a first center frequency and having a second output designed for outputting a second signal with a second center frequency;
   at least one first input terminal on the surface of the semiconductor body, which is connected to the at least one input of the power amplifier;
   at least one first output tap on the surface of the semiconductor body, which is connected to the first output of the power amplifier;
   a second output tap and a third output tap on the surface of the semiconductor body, which are connected to the second output of the power amplifier;
   a first line wire connected to the second output tap and a second line wire connected to the third output tap; and
   a charge store coupled to the third output tap and to the second line wire connected to the third output tap that comprises a resonant circuit.

2. The power amplifier arrangement of claim 1, wherein the charge store comprises a capacitor having a first terminal and a second terminal, wherein the first terminal is coupled to the third output tap and the second terminal is connected to a reference potential.

3. The power amplifier arrangement of claim 1, wherein the at least one first output tap, the second output tap and the third output tap are designed as contact pads on the surface of the semiconductor body.

4. The power amplifier arrangement of claim 1, wherein the charge store is arranged outside the semiconductor body.

5. The power amplifier arrangement of claim 1, wherein the at least one first output tap is connected to a third line wire.

6. The power amplifier arrangement of claim 1, wherein the third output tap on the surface of the semiconductor body is at a greater distance from the at least one first output tap than the second output tap is from the at least one first output tap.

7. The power amplifier arrangement of claim 1, wherein the first and second line wires are designed as bonding wires for contact-connecting the second output tap to a first housing pin and the third output tap to a second housing pin.

8. The power amplifier arrangement of claim 7, wherein the charge store is arranged outside a housing comprising the first and second housing pins and is connected to the terminal pin to which the second line wire is coupled.

9. The power amplifier arrangement of claim 1, wherein the charge store is designed with an actuating input for tuning a capacitance of the charge store.

10. The power amplifier arrangement of claim 1, wherein the resonant circuit has a frequency transfer response with a characteristic suitable for suppressing a harmonic component of the second signal at the second and third output tap, the harmonic component having an integral multiple of the second center frequency.

11. The power amplifier arrangement of claim 1, wherein an output signal is present at the second and third output taps and has a harmonic signal component, wherein the resonant circuit is configured for carrying current of the harmonic signal component.

12. The power amplifier arrangement of claim 1, wherein the first center frequency is about 5 gigahertz and the second center frequency is about 2.5 gigahertz.

13. A power amplifier arrangement, comprising:
a housing comprising:
   a power amplifier that receives an input signal and generates a first output signal having a first center frequency and a second output signal having a second center frequency, wherein the first center frequency is greater than the second center frequency;
   first and second terminals that receive the first output signal from the power amplifier; and
   third and fourth terminals that receive the second output signal from the power amplifier;
a resonator circuit comprising an inductive component and a capacitive component that receives the second output signal from the third and fourth terminals and suppresses undesired signal components within the second output signal;
a matching network that receives the second output signal from the resonator circuit and matches the second output signal to a second antenna;
a first antenna that receives the first output signal from the first and second terminals; and
the second antenna that receives the second output signal from the matching network.

14. The power amplifier arrangement of claim 13, wherein the matching network comprises a first stripline connected to the third terminal, a second stripline connected to the first stripline in series, wherein the first stripline and the second stripline have lengths selected to match a characteristic impedance, and a capacitor connected between the first stripline and the second stripline.

15. The power amplifier arrangement of claim 13, wherein the housing further comprises a logic circuit coupled to the power amplifier that determines power gain for the first and second output signals.

16. The power amplifier arrangement of claim 13, wherein the inductive component of the resonator circuit comprises a line wire connected to the fourth terminal and having a selected inductance.

17. The power amplifier arrangement of claim 16, wherein the capacitive component comprises a capacitor connected to the line wire and ground, wherein the capacitor has a selected capacitance that, along with the selected inductance, suppresses the undesired signal components within the second signal.

18. A method for processing a radiofrequency signal, comprising:
providing an input signal to be amplified;
providing an amplifier having a first and a second output tap;
feeding the input signal to be amplified to the amplifier;
amplifying the input signal by the amplifier, generating a first output signal having a first signal component with a first center frequency and a second, undesirable signal component with a second center frequency;
tapping off the amplified signal at the first output tap and at the second output tap;
feeding the amplified signal tapped off at the second output tap to a series resonator, the resonant frequency of which essentially corresponds to the second center frequency; and
suppressing the second signal component at the first output tap by resonant amplification of the second signal component at the second output tap.

19. The method of claim 18, wherein amplifying the input signal further comprises generating a second output signal having a center frequency at about the second center frequency of the second, undesirable signal component.

* * * * *